United States Patent
Miyamoto et al.

(10) Patent No.: US 7,914,366 B2
(45) Date of Patent: Mar. 29, 2011

(54) STORAGE APPARATUS

(75) Inventors: Kenichi Miyamoto, Odawara (JP); Yasuji Morishita, Odawara (JP)

(73) Assignee: Hitachi, Ltd., Tokyo (JP)

( * ) Notice: Subject to any disclaimer, the term of this patent is extended or adjusted under 35 U.S.C. 154(b) by 1299 days.

(21) Appl. No.: 11/437,693

(22) Filed: May 22, 2006

(65) Prior Publication Data

US 2007/0220912 A1 Sep. 27, 2007

(30) Foreign Application Priority Data

Mar. 24, 2006 (JP) ................. 2006-083445

(51) Int. Cl.
*H05K 5/00* (2006.01)
*H05K 7/20* (2006.01)
(52) U.S. Cl. ....................... 454/184; 361/694
(58) Field of Classification Search .......... 454/184; 62/259.2; 361/694
See application file for complete search history.

(56) References Cited

U.S. PATENT DOCUMENTS

| | | | | |
|---|---|---|---|---|
| 5,136,464 | A | * | 8/1992 | Ohmori ............ 361/694 |
| 7,046,513 | B2 | * | 5/2006 | Nishiyama et al. ......... 361/695 |
| 2004/0264131 | A1 | | 12/2004 | Nishiyama et al. |

FOREIGN PATENT DOCUMENTS

| | | |
|---|---|---|
| JP | 04-226098 | 8/1992 |
| JP | 08-273345 | 3/1995 |
| JP | 08-273345 | 10/1996 |
| JP | 09-274791 | 10/1997 |
| JP | 2005-019562 | 6/2003 |

OTHER PUBLICATIONS

Extended European Search Report mailed Nov. 5, 2009.

* cited by examiner

*Primary Examiner* — Henry Yuen
*Assistant Examiner* — Helena Kosanovic
(74) *Attorney, Agent, or Firm* — Foley & Lardner LLP

(57) ABSTRACT

Provided is a cooling method for realizing efficient cooling of a storage apparatus with an airflow separation structure. This storage apparatus has a plurality of cooling areas formed in the cabinet; an external air introduction/discharge device for directing external air to the respective cooling areas, and thereafter discharging the external air from a discharge area of the cabinet outside the cabinet; and an external air guidance area for guiding the external air that passed through each of the cooling areas to the discharge area; wherein the external air guidance area is configured so that the external air that passed through one cooling area will not get mixed with the external air that passed through another cooling area.

13 Claims, 15 Drawing Sheets

FIG.8
(A)
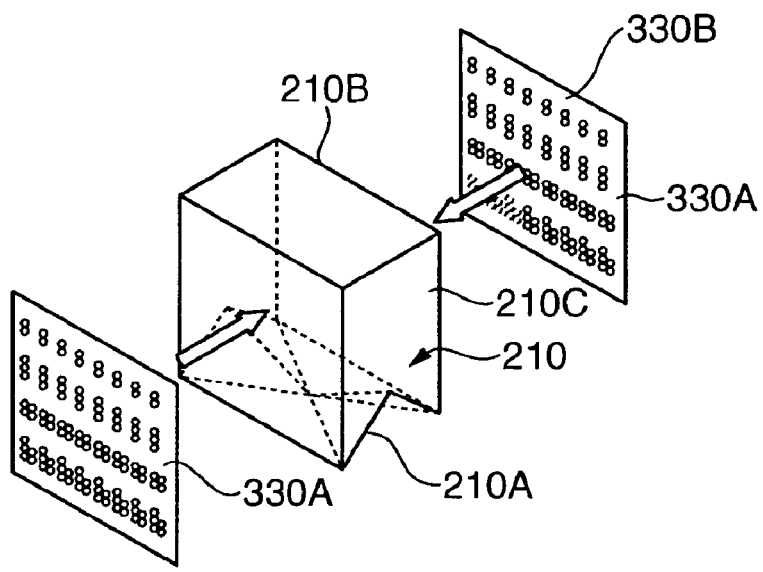
(B)
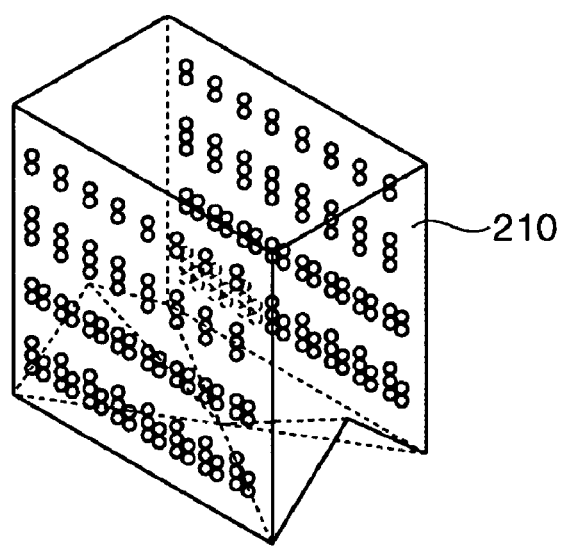

FIG.10
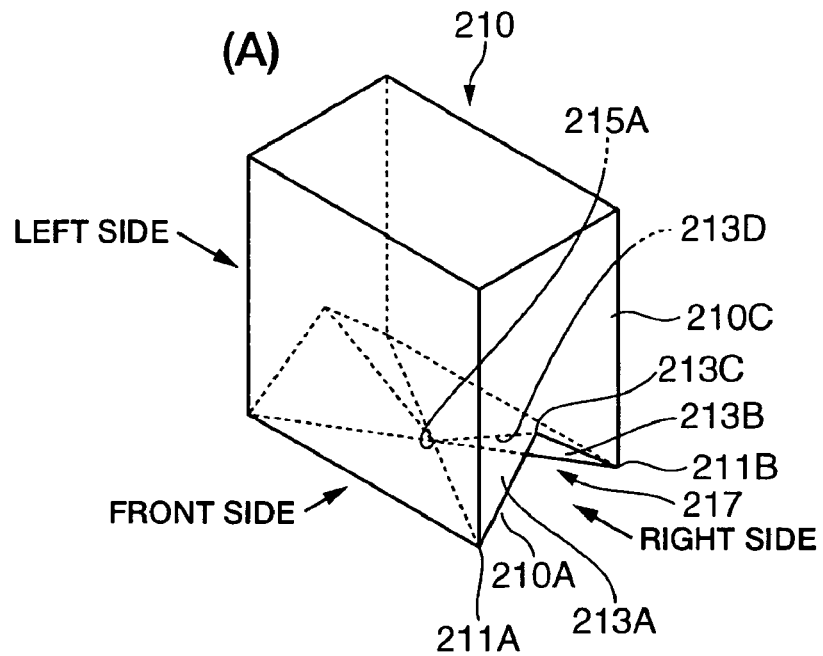
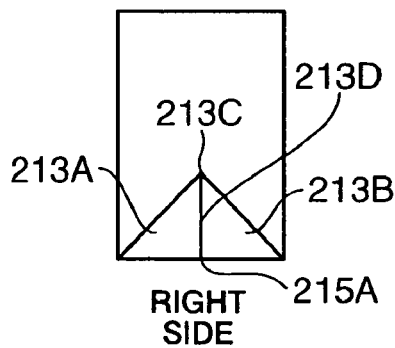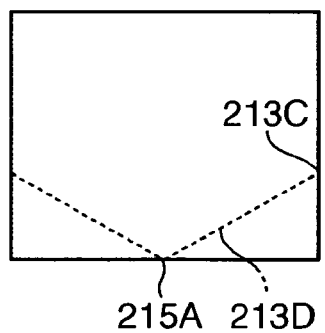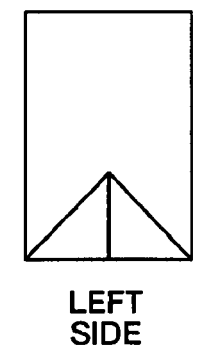
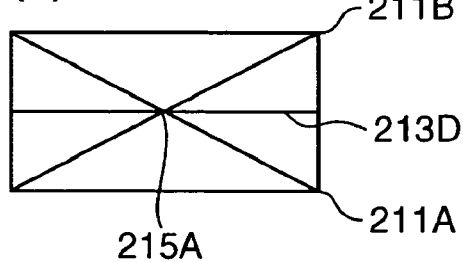

FIG.11
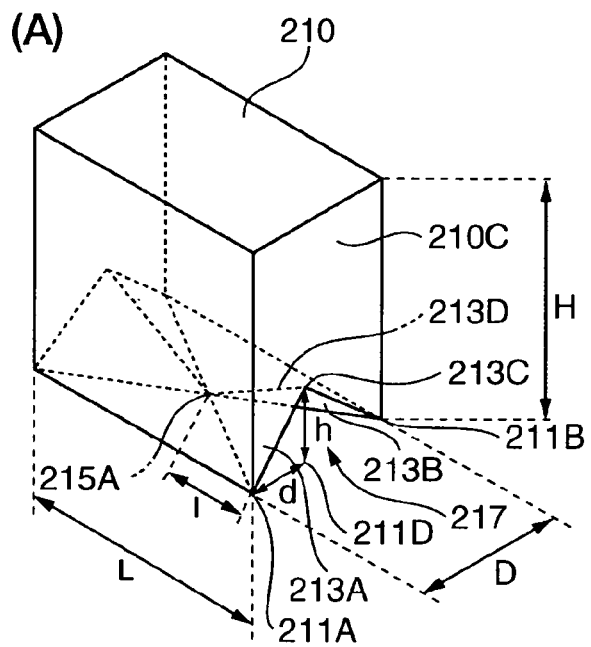
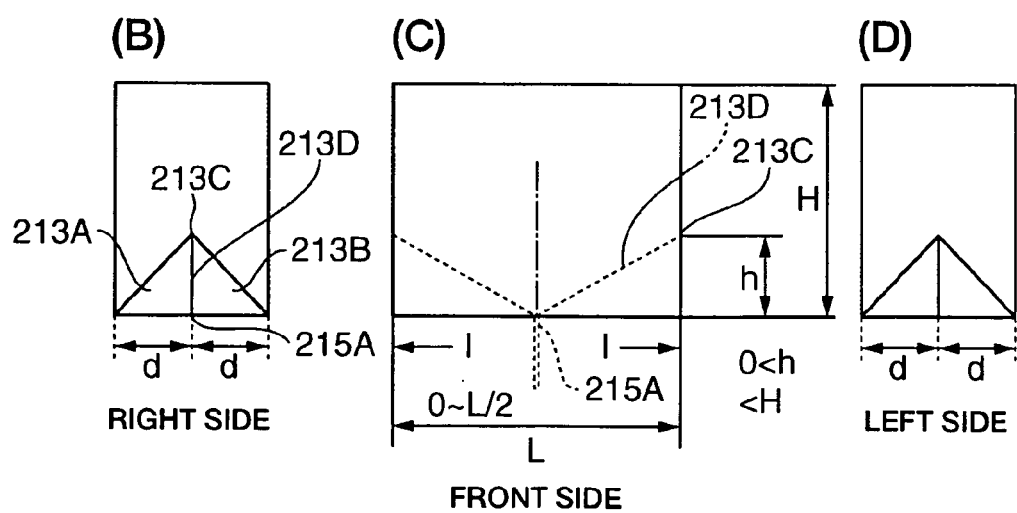
RIGHT SIDE
FRONT SIDE
LEFT SIDE

FIG.12
(A)
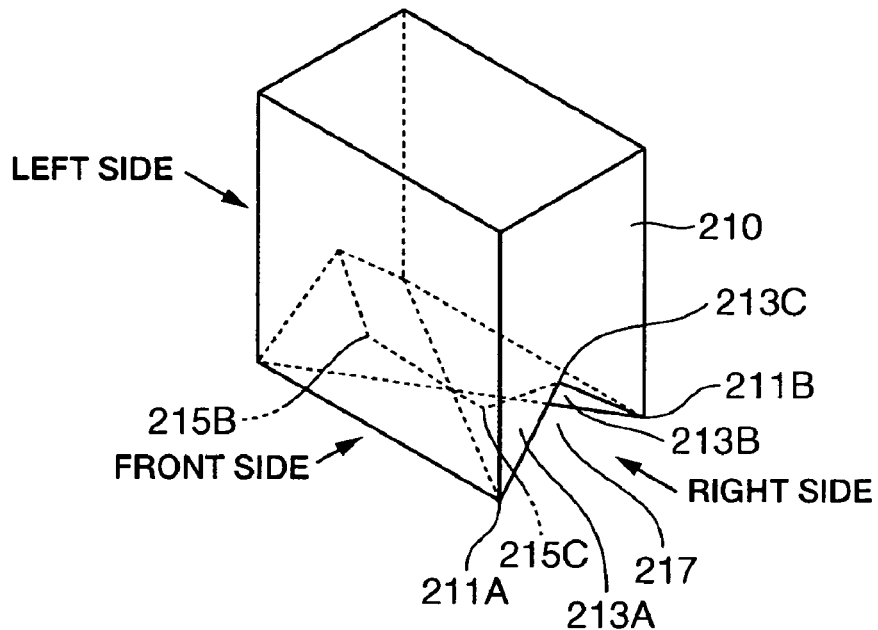
(B)
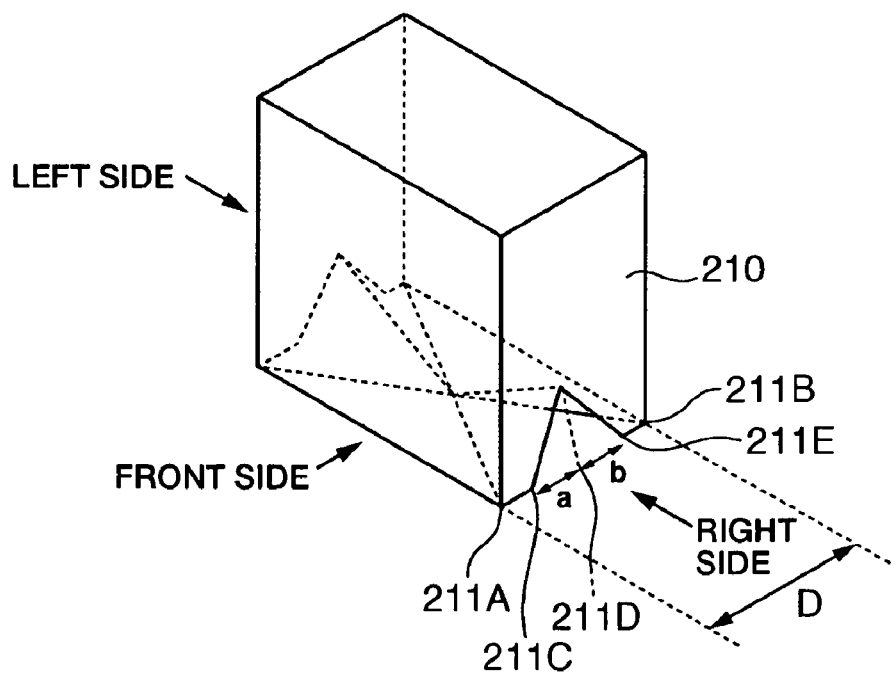

FIG.13
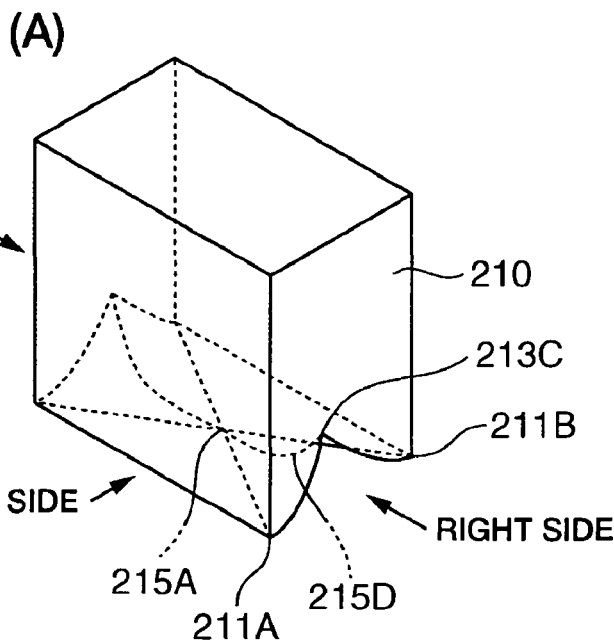
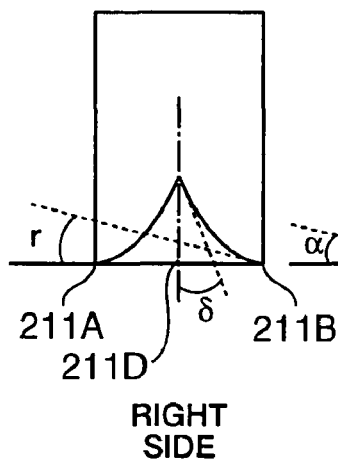
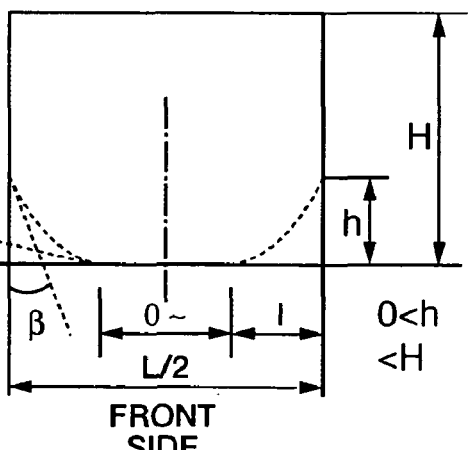
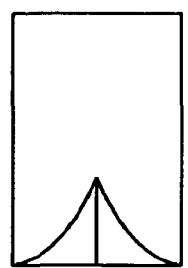
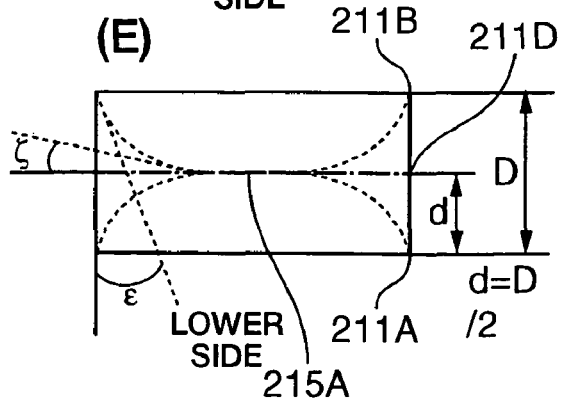

STORAGE APPARATUS

CROSS-REFERENCES TO RELATED APPLICATIONS

This application relates to and claims priority from Japanese Patent Application No. 2006-083445, filed on Mar. 24, 2006, the entire disclosure of which is incorporated herein by reference.

BACKGROUND

The present invention generally relates to a high-density mounting storage apparatus housing numerous memory mediums in a cabinet, and in particular relates to a storage apparatus having a configuration for improving the cooling capability in the cabinet.

Generally speaking, a part of the power supplied to a hard disk drive in an electronic apparatus is converted into frictional heat caused by the rotation of the hard disk or resistance heat of an electronic circuit. With a storage apparatus having a plurality of hard disk drives arranged in an array, the denser these hard disk drives are mounted, the higher the heating value. Thus, while the storage apparatus is being operated, it is necessary to cool the hard disk drives and electronic circuits in the storage apparatus.

In recent years, as represented by a large storage apparatus configured with a RAID (Redundant Array of Independent Disks) system, for instance, the storage capacity of storage apparatuses is of an increasing trend. In other words, the number of hard disk drives mounted on the storage apparatus is increasing, which means that the mounting density of the hard disk drives is increasing.

As a result of this high-density mounting, the power consumption and heating value of storage apparatuses are ever increasing. As a measure against such heat generation, although a fan for introducing external air into the storage apparatus is being enlarged, resistance against the circulation of external air in the storage apparatus is significant due to the high-density mounting of the hard disk drives, and an effect of sufficiently cooling the inside of the storage apparatus has not yet been achieved. Thus, there is no choice but to enlarge the fan even further, which results in distracting noise caused by the fan, and the electricity consumption for operating the fan will also increase.

Conventionally, as a magnetic disk device having this kind of cooling system, as described in Japanese Patent Laid-Open Publication No. H8-273345, proposed is a magnetic disk device configured by including in a single apparatus cabinet a plurality of magnetic disk drives for magnetically storing information, a control circuit board mounted with a control circuit for controlling such magnetic disk drives, and a ventilation means for cooling the magnetic disk drives and control circuit board with air cooling, wherein the magnetic disk drives, control circuit board and ventilation means are retained in a frame to configure a single disk box, and a plurality of such disk boxes are housed in a single apparatus cabinet.

Further, Japanese Patent Laid-Open Publication No. 2005-19562 describes a storage apparatus including a ventilation unit provided on a ceiling of a cabinet for ventilating the interior and exterior of the cabinet, a hollow duct having two opening surfaces and arranged in a first housing unit for housing a first electronics device housing box formed at a level on the side near the ceiling so that the first opening surface faces the ventilation unit, a second opening surface faces a second housing unit for housing a second electronics device housing box formed at a level on the side far from the ceiling, air inside the second electronics device housing box housed in the second housing unit is discharged from the ventilation unit outside the cabinet through the interior of the duct, and air in the first electronics device housing box housed in the first housing unit is discharged from the ventilation unit outside the cabinet along the outer wall surface of the duct.

SUMMARY

Nevertheless, although Japanese Patent Laid-Open Publication No. H8-273345 proposes providing a ventilation means to each disk box for cooling each disk unit, no consideration is given to streamlining the exhaust air or miniaturizing the fan.

Further, with Japanese Patent Laid-Open Publication No. 2005-19562, since the fan located at the upper row of the first housing unit also has the role of transporting both the exhaust air from the second housing unit and the exhaust air from the first housing unit outside the cabinet, the amount of external air to be discharged will increase. Thus, it is difficult for external air in the cabinet in a location away from the fan to be discharged outside the cabinet, and, as result, external air tends to remain in the cabinet, and the cooling capability will deteriorate thereby.

Moreover, since the position of the external air that cooled the first housing unit and the external air that cooled the second housing unit flow in the same duct, the position of such former external air and latter external air entering the duct are different; that is, because the external air flowing in the first housing unit enters the duct from midway and the external air flowing in the second housing unit enters from the starting end of the duct, there is a problem in that the circulation of external air in the duct will become off balance, and the cooling capability will deteriorate. In order to avoid this problem, it is necessary to enlarge the fan even more.

The present invention was devised in view of the foregoing problems, and an object thereof is to inhibit the noise generated by the fan upon cooling the storage apparatus, and inhibit the electricity consumption required for such cooling.

In order to achieve the foregoing object, the present invention is characterized in that the flow of external air for cooling the first housing unit and the flow of external air for cooling the second housing unit are not mixed in the storage apparatus.

In other words, the present invention provides a storage apparatus having in a cabinet, and arranged in one direction, a memory medium housing unit for storing a plurality of memory mediums, a control unit for performing data I/O processing to the memory mediums in response to a data I/O request from an upper-level host system, and a power supply unit for supplying power to the memory medium housing unit and the control unit, including: a plurality of cooling areas formed in the cabinet; an external air introduction/discharge device for directing external air to the respective cooling areas, and thereafter discharging the external air from a discharge area of the cabinet outside the cabinet; and an external air guidance area for guiding the external air that passed through each of the cooling areas to the discharge area; wherein the external air guidance area is configured so that the external air that passed through one cooling area will not get mixed with the external air that passed through another cooling area.

According to the present invention, it is possible to inhibit the noise generated by the fan upon cooling the storage apparatus, and inhibit the electricity consumption required for such cooling.

DESCRIPTION OF DRAWINGS

FIG. 8A and FIG. 8B are diagrams showing a state where a panel 330 is provided to the frame 210B at the front side and back side of the structure;

FIG. 10A to FIG. 10E are diagrams showing the configuration of the structure;

FIG. 11A to FIG. 11D are diagrams showing the measurement of the structure;

FIG. 12A to FIG. 12B are diagrams showing a modified example of the structure;

FIG. 13A to FIG. 13E are diagrams showing a modified example of the structure;

DETAILED DESCRIPTION

Figure 1:
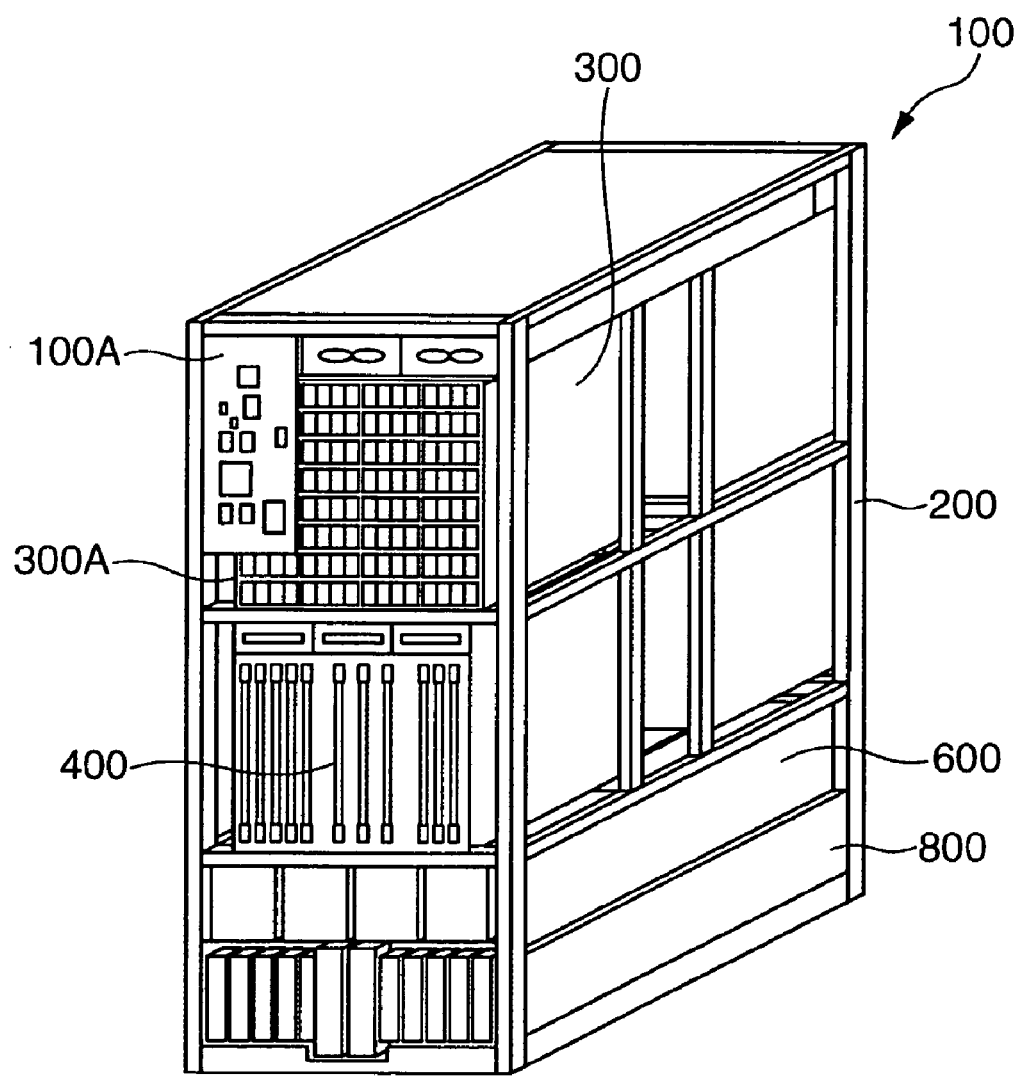
FIG. 1 is a perspective view showing the overall storage apparatus.

Embodiments of the present invention are now explained with reference to the attached drawings. FIG. 1 is a perspective view showing the overall storage apparatus. As shown in FIG. 1, the storage apparatus 100 is configured by housing, in a cabinet 200 forming a large rectangular shape, a DC power supply 600, a battery 800, an LG box (control unit) 400 and an HDD box 300 from the ground plane side of the cabinet toward the top side of the cabinet in that order.

An upper-level system not shown (a host system for example) is connected to the storage apparatus illustrated in FIG. 1, and data to be accessed by the host system is stored in the hard disk drive in the HDD box 300. Each HDD box 300 has a plurality of hard disk drives 300A arranged in an array. The LG box 400 has a control circuit for controlling the input and output of data between the host system and storage apparatus. The DC power supply 600 converts AC power into DC power, and supplies DC power to the LG box and HDD box. The battery 800 is a standby power supply device.

Figure 2:
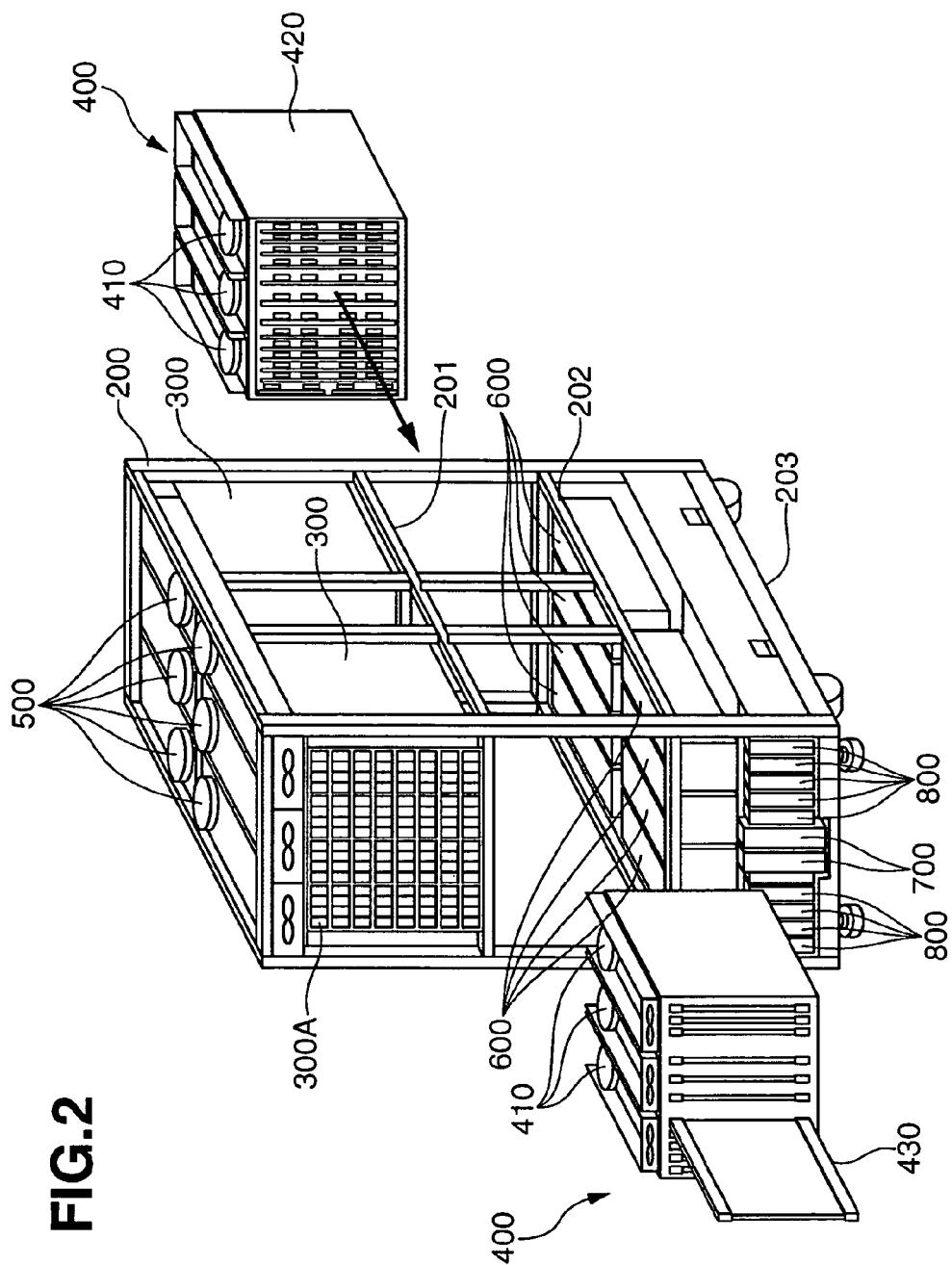
FIG. 2 is a perspective view showing a state where the respective units are housed in a cabinet 200 of the storage apparatus 100.

FIG. 2 is a perspective view showing a state where the respective units are housed in the cabinet 200 of the storage apparatus 100. The foregoing HDD box 300 is housed in the upper row of the storage apparatus 10. The hard disk drive 300A in the HDD box 300 is insertably and removably housed in the HDD box. Electric fans 500 are provided at the top face of the storage apparatus. These electric fans guide the external air from outside the cabinet toward the center of the cabinet via the HDD box, and discharge this external air from the top of the storage apparatus.

A total of 64 disk drives 310 are loaded in an array in the HDD box 300; 4 rows in the direction of gravitational force, and 16 rows in a direction perpendicular to the vertical direction. Incidentally, a plurality of frames are assembled to form a rectangular shape so as to configure the overall cabinet 200, and the upper row, middle row and lower row of the cabinet are formed with partition frames 201, 202. The HDD box 300 is supported above the partition frame 201. The control unit 400 is being supported and fixed by the partition frame 202 in the middle row formed between the partition frame 201 and partition frame 202. Further, the DC power supply 600, battery 800 and AC box 700 are housed in the lower row formed between the partition frames and the frame 203 at the bottom of the cabinet.

The LG box (control unit) 400 has a plurality of logical substrates 430 with a control circuit formed thereon. The logical substrate 430 is insertably and removably housed in the LG box. The logical substrate 430 includes a channel adapter for performing communication between the storage apparatus 100 and information processing device in order to input and output data, a disk adapter for performing I/O processing of data stored in the disk drive 300A, and a cache memory for storing data sent to and received from the information processing device. Electric fans 410 for drawing in external air from the outside to inside of the cabinet are provided to the top face of the LG box 400. These electric fans guide external air into the cabinet via the power supply unit and LG box, and then discharge such external air outside the cabinet.

The battery 800, AC box 700 and DC power supply 600 are housed inside the lower row of the cabinet 200. These integrally form the power supply unit of the storage apparatus. By disposing the heavy power supply unit in the lower row of the storage apparatus 100, it is possible to stabilize the storage apparatus upon grounding the storage apparatus. Incidentally, as shown in FIG. 1, an operational input unit 100A is provided to the front side of the storage apparatus.

The DC power supply 600 converts AC power into DC power, and supplies DC power to the LG box 400 and disk drive 310. The battery 800 supplies backup powder to the respective components inside the storage apparatus 100 during a blackout or failure in the DC power supply 600. The AC box 700 is an intake of AC power to the storage apparatus 100, and functions as a breaker. AC power introduced into the AC box 700 is supplied to the DC power supply 600. The significant heating value generated by the power supply unit in the lower row of the storage is cooled by the external air supplied into the cabinet with the electric fans 410. Incidentally, as shown in FIG. 2, a pair of HDD boxes 300, LG boxes 400 and power supply units are respectively disposed and housed in the storage apparatus; one from the front side and one from the back side of the storage apparatus.

Figure 3:
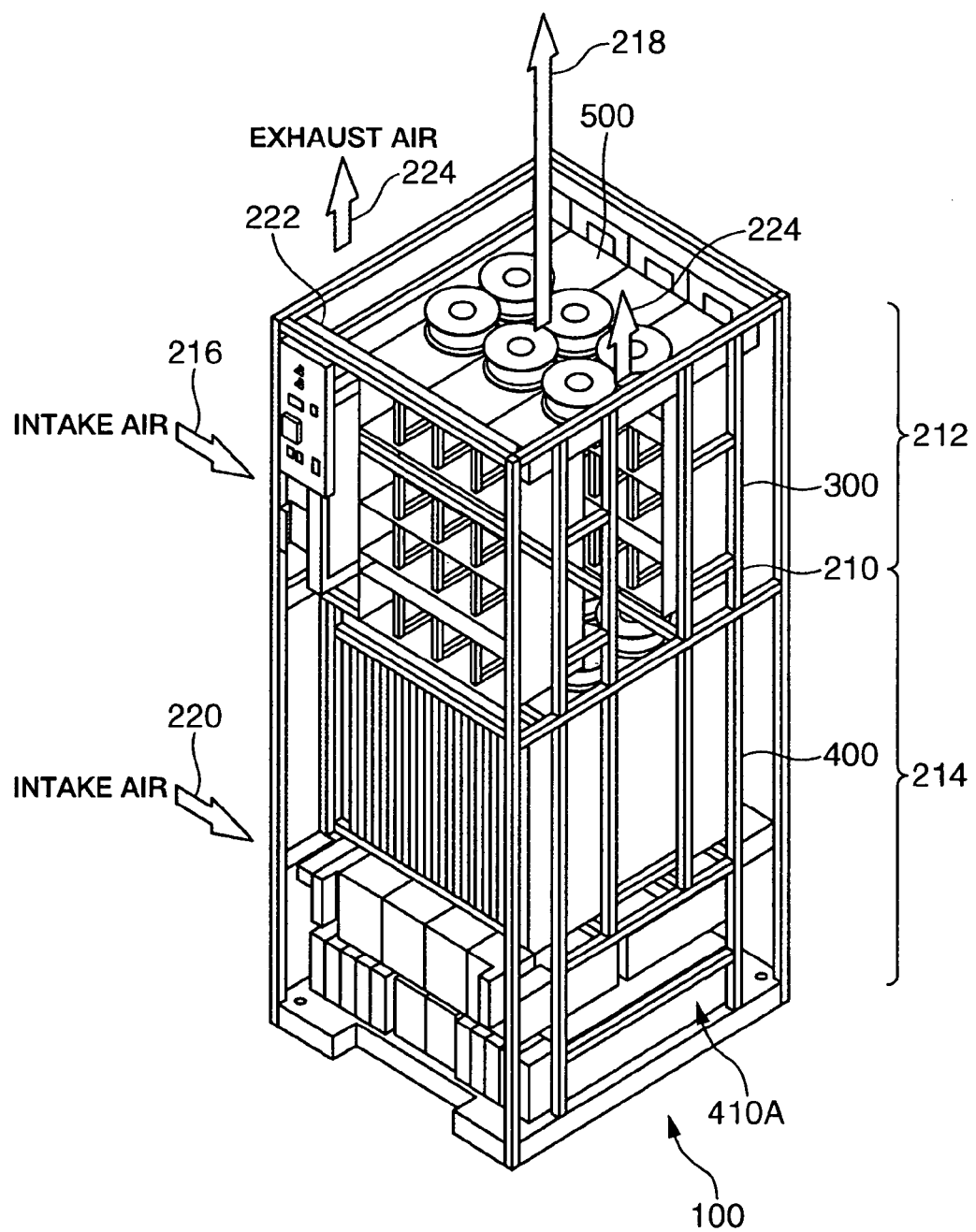
FIG. 3 is a perspective view of the overall storage apparatus for showing the cooling system of the storage apparatus.

FIG. 3 is a perspective view of the overall storage apparatus for showing the cooling system of the storage apparatus. The cooling area of the storage apparatus is broadly separated into two sections; in other words, the cooling area is configured from an area 212 for cooling the HDD box 300, and an area 214 for cooling the LG box 400 and power supply unit 410A. The electric fan 500 aspirates the external air 216 from the outside to inside of the cabinet via the HDD box. This external air is discharged outside the storage apparatus 100 as exhaust air 218 by the electric fan 500. The external air 216 passes through the vicinity of the hard disk drive while flowing from the outside to inside of the cabinet so as to cool the hard disk drive.

Although not directly shown in FIG. 3, the electric fan 410 explained with reference to FIG. 2 aspirates the external air 220 from the outside to inside of the cabinet via the LG box 400 and power supply unit 410A, and this external air rises in the cabinet, passes through a space 222 formed between the HDD box and side face of the cabinet, and is discharged outside the cabinet as exhaust air 224. The external air guidance route or external air guidance area from the external air being introduced as intake air 216 and thereafter discharged outside the cabinet as exhaust air 218, and the route or area from the external air being introduced as intake air 220 and thereafter discharged outside the cabinet as exhaust air 224 from the left and right side faces of the cabinet are formed so that the external air of the former and external air of the latter do not get mixed. In other words, it is possible to substantially avoid the external air 220 from becoming the external air for cooling the HDD box.

Figure 4:
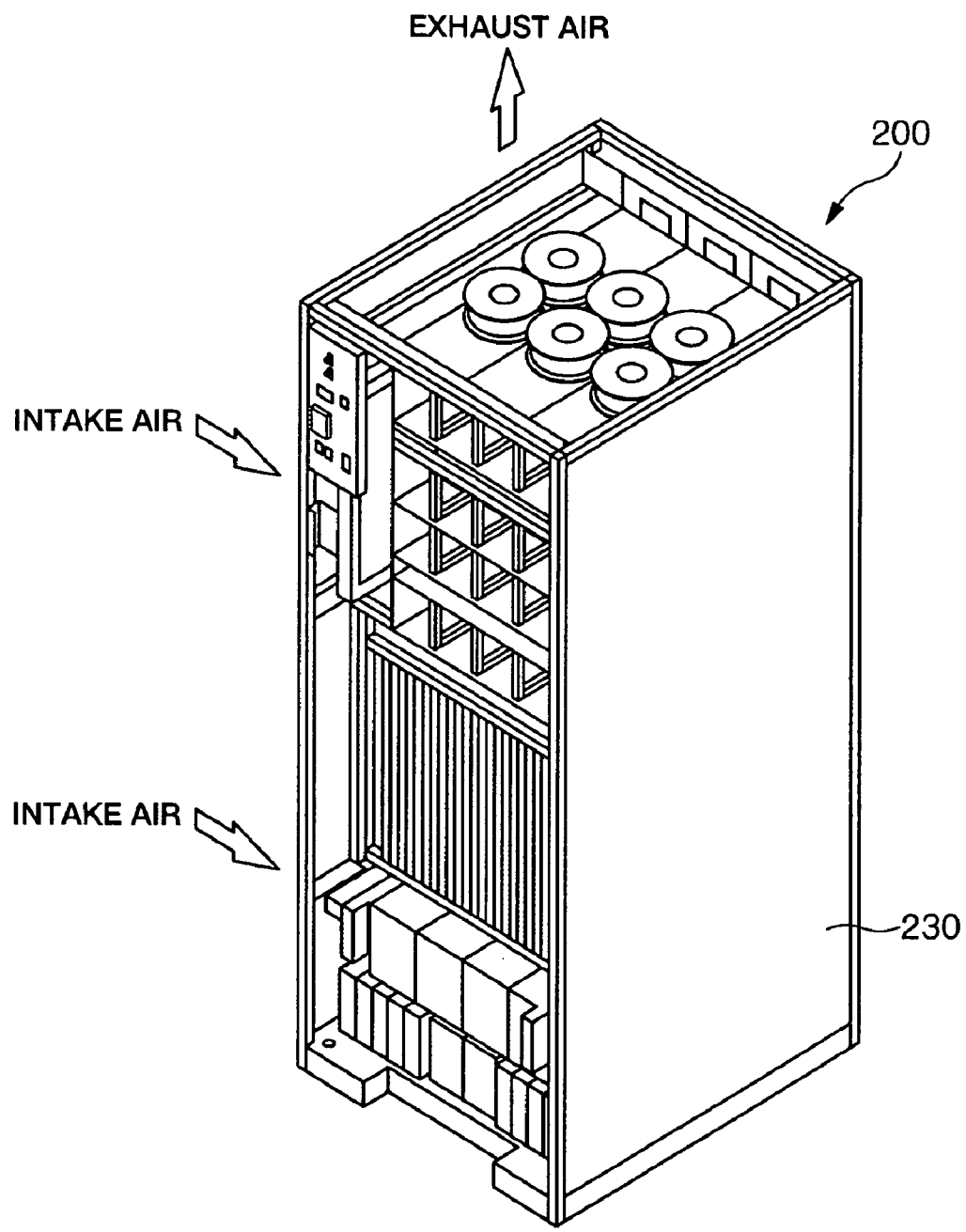
FIG. 4 is a diagram showing a state where a decorative panel 230 is disposed around the cabinet 200.

Incidentally, as shown in FIG. 4, a decorative panel 230 is provided around the cabinet 200. The decorative panel, although not shown, is provided with a plurality of openings for introducing external air. A ventilation space is formed between the decorative panel 230 and cabinet 200. Moreover, in FIG. 3, the external air is aspirated into the storage apparatus from the front side, back side, right side and left side of the storage apparatus.

Figure 5:
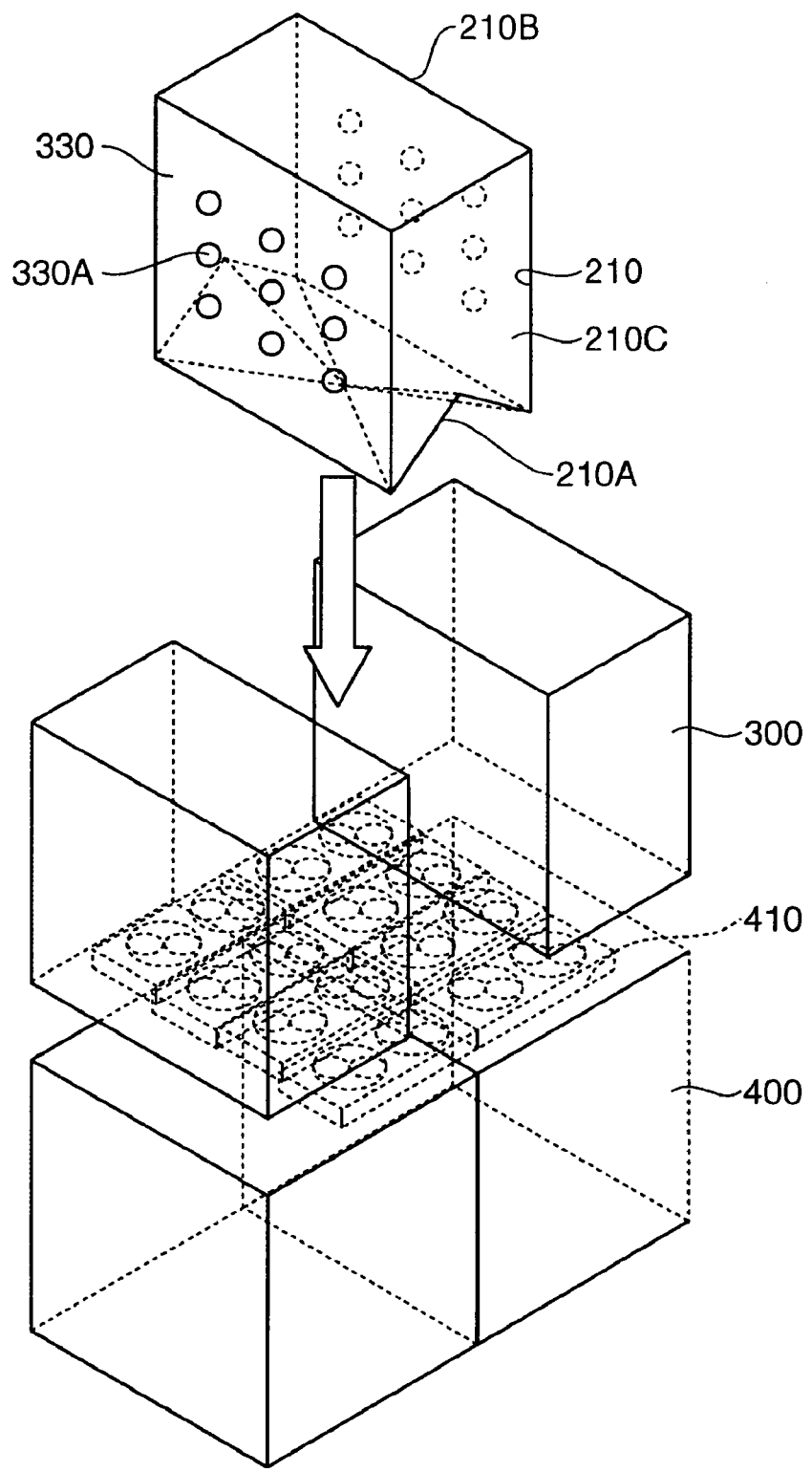
FIG. 5 is a diagram showing a configuration for independently forming, in essence, a guidance route of the external air formed in the storage apparatus for each cooling area.
Figure 6:
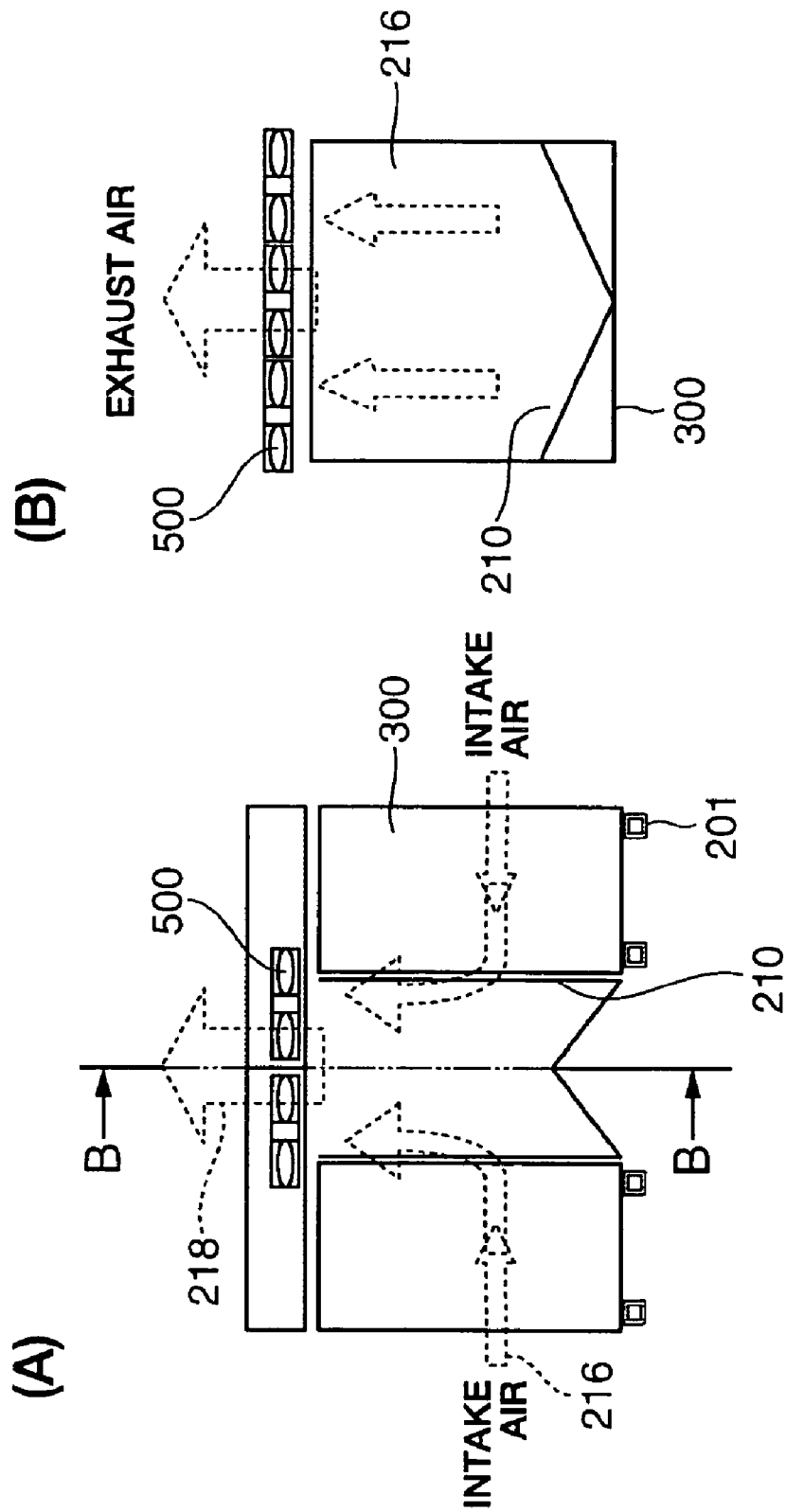
FIG. 6A and FIG. 6B are diagrams showing a state where intake air 216 from the upper row of the cabinet is discharged outside the cabinet as exhaust air 218.
Figure 7:
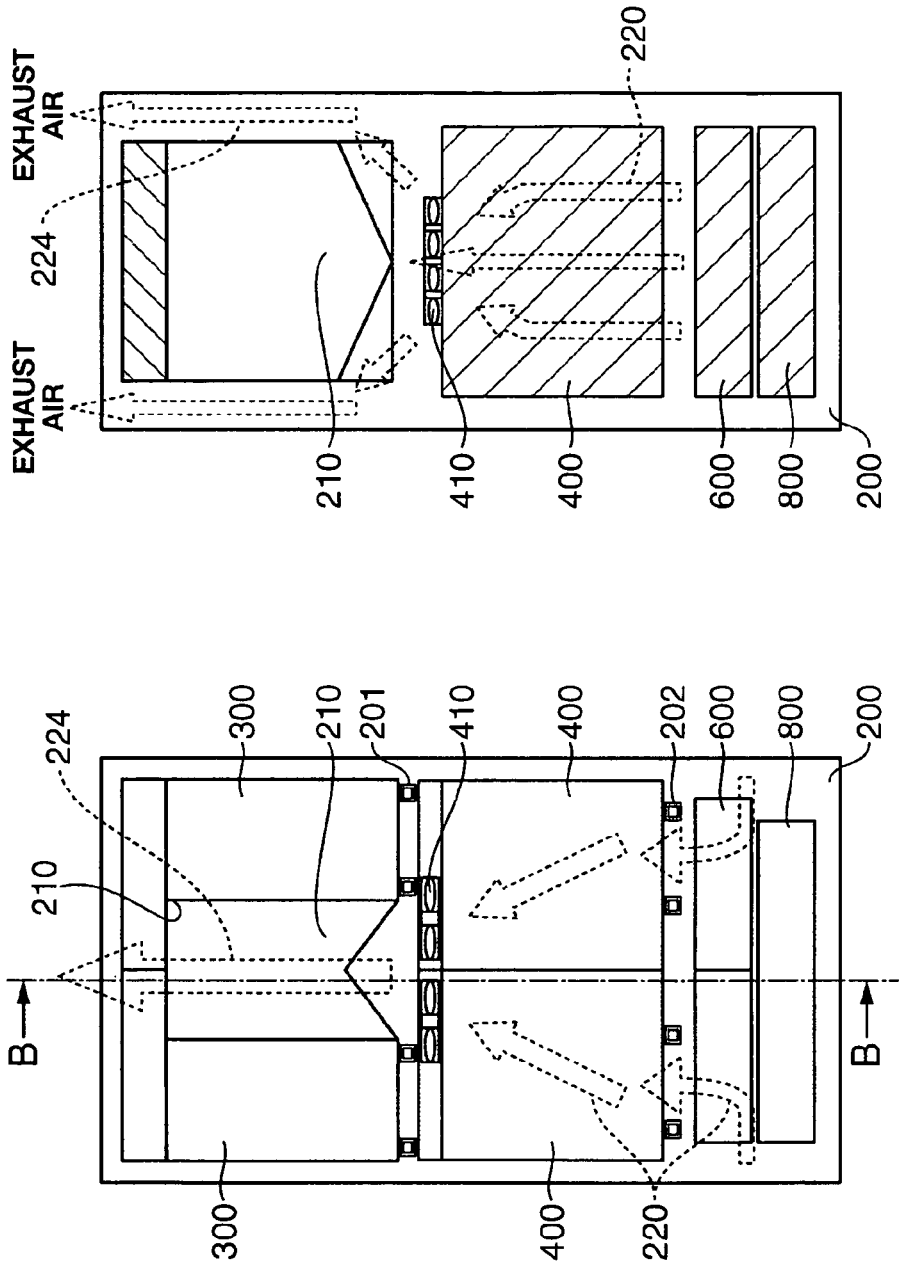
FIG. 7A and FIG. 7B are diagrams showing a state where external air 220 introduced from the middle and lower parts of the cabinet 200 is discharged outside the storage apparatus.

Next, the configuration for independently forming, in essence, a guidance route of the external air formed in the storage apparatus for each of the two cooling areas is explained. FIG. 5 is a perspective view showing this configuration. A pair of HDD boxes 300 is housed inside the storage apparatus respectively from the front side and back side of the storage apparatus. Provided between the pair of HDD boxes 300 is a structure 210 substantially differentiating the introduction route of the intake air 220 passing through the cabinet as shown in FIG. 3 from the introduction route of the external air 216 passing through the cabinet. As a result of this structure, the introduction route of external air in the cabinet will be as shown in FIGS. 6A and 6B, and FIGS. 7A and 7B. In FIGS. 6A and 6B, although this partially overlaps with the explanation of FIG. 3, intake air 216 enters the structure 210 from the front side and left/right sides of the HDD box, and is discharged outside the cabinet as exhaust air 218 with the fan 500 in the exhaust air area of the storage apparatus. In FIG. 7, external air 200 aspirated from the periphery of the middle row and lower row of the cabinet 200, without passing through the inside of the structure 210, rises between the left/right sides on the outside of the structure 210 and the cabinet; that is, between the cabinet and the housing area of the HDD box, and is discharged outside the storage apparatus as exhaust air 224.

Next, returning to FIG. 5 to explain the structure 210 in detail, the structure 210 is formed in a rectangular shape where the planar surface and inside are opened. The bottom face of the structure 210 is shielded so that the external air 220 (refer to FIG. 7) will not enter the structure. This is the same for the left and right sides of the structure 210. As shown in FIG. 8A, the structure 210 is configured by including a bottom face 210A, left and right side faces 210C, and a frame 210B for forming the overall structure in a rectangular shape. At the front side and back side of the structure, a panel 330 is fixed to the frame 210B. This panel, as shown in FIG. 5, is facing the HDD box. A plurality of openings 330A are formed on the panel 330 to allow external air to enter into the structure 210. The density of forming such openings is formed so as to increase toward the lower end of the structure 210 (toward the bottom face of the storage apparatus) (refer to FIG. 8B).

Figure 9:
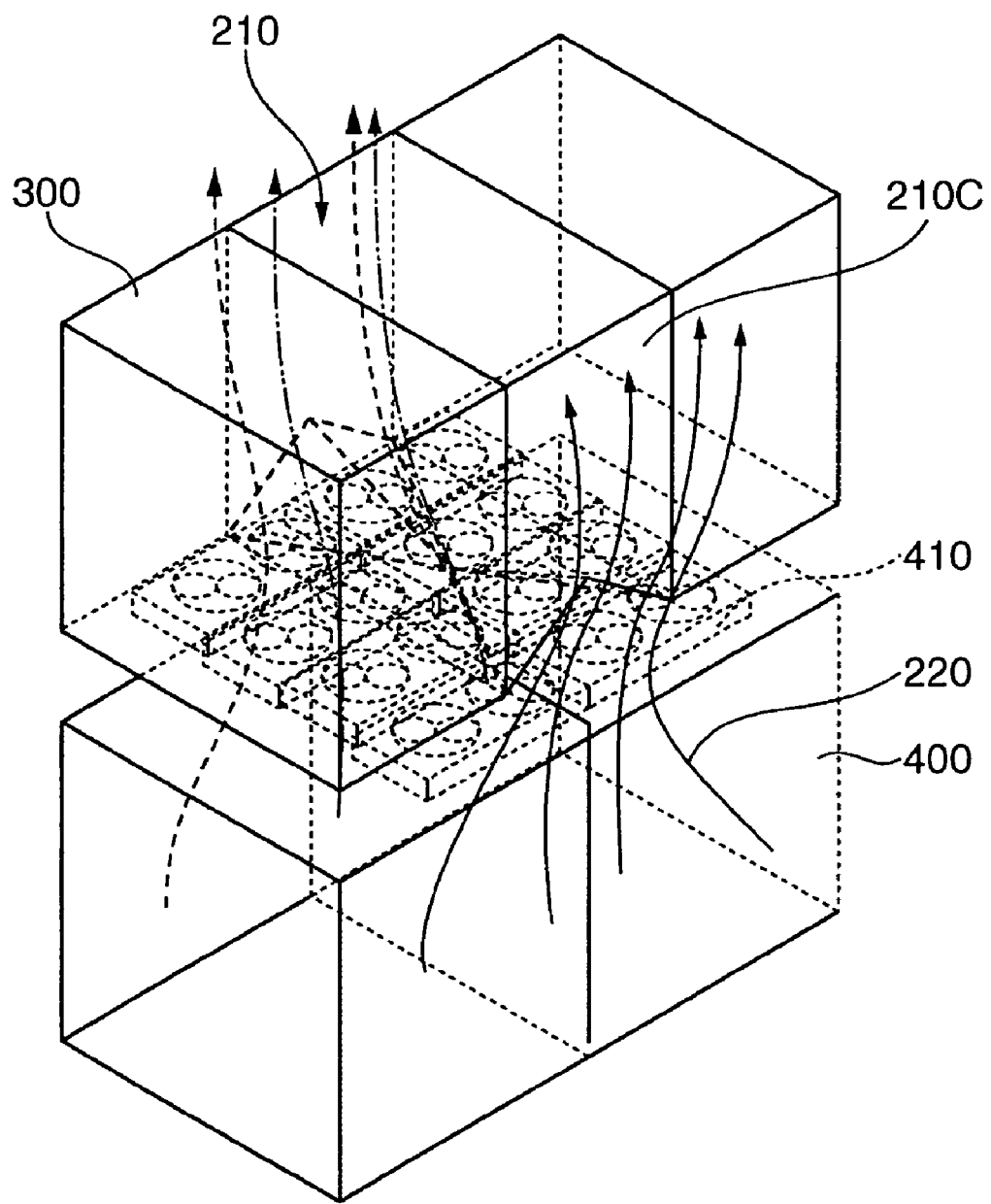
FIG. 9 is a diagram showing a state where external air 220 introduced from the middle and lower parts of the cabinet 200 is discharged outside the storage apparatus.

This is in order to deal with the situation where the suction power for introducing external air into the structure 210 may weaken as it becomes farther from the fan 500. Outside air 216 shown in FIG. 3 is guided into the structure 210 via the openings 330A, and, as shown in FIG. 9, the external air 220 rises in the cabinet along the left and right sides 210C of the structure, and does not rise through the structure 210. Therefore, the structure 210 is able to separate the area to which the intake air 216 is directed and the area to which the intake air 220 is directed. The fan 500 will only require a capacity sufficient in aspirating and discharging the intake air 216, and the fan 410 will only require a capacity sufficient in aspirating and discharging the intake air 220.

In other words, the structure 210 is configured such as the upper part thereof is formed in an open box shape, a fan 500 is provided to the upper part of the structure, and a fan 410 is also provided facing downward toward the bottom of the structure 10 so as to separate the external air. Therefore, the noise generated during the operation of the fan can be reduced, and it is possible to discharge external air efficiently. Incidentally, since the structure 210 was not provided conventionally, the intake air 220 was mixed with the intake air 216 in the cabinet, and the mixed external air was collectively discharged with the fan 500. Thus, there was no choice but to enlarge the fan 500. As a result, the power consumption and noise of the fan would increase. Further, although the enlargement of the axis for rotating the wings of the fan would shield the air passage, by miniaturizing the fan, such fan can be installed in accordance with the area of the passage.

As shown in FIG. 10A, inclined faces 213A and 213B are formed from the front side end 211A and back side end 211B of the bottom face 210A toward the center of the structure 210 at the left and right sides of the bottom face 210A of the structure 210. Moreover, a ridge line 213D is formed from the center 215A of the bottom face 210A so as to connect the inclined faces 213A and 213B and an intersection 213C. As a result of the inclined faces 213A, 213B and the ridge line 213D, a pair of semitriangular cone-shaped concave portions 217 is formed from the center of the structure to the left and right sides, respectively. Outside air 220 is force fed to the structure 210 side with the fan 400, thereafter comes in contact with the bottom face 210A of the structure 210, and directed to the left and right side faces 210C of the structure along the concave portion 217. With respect to the width of this concave portion, since the concave portion is of a triangular cone shape, the width of the concave portion gradually becomes larger from the center of the structure toward the left and right sides, and external air 220 is directed smoothly to from the center of the structure to the left and right sides. In other words, external air 220 is directed smoothly from the center of the structure to the left and right sides with the pair of concave portions 217 formed from the center of the structure toward the left and right sides. That is to say, the structure 210 is configured to have a concave portion so that the exhaust air from the LG box flows toward a direction in which the HDD box is not installed; that is, in a direction toward the side face. Further, the inclined faces 213A, 213B are able to direct external air from the front side and back side of the structure to the center of the structure. The flow of this external air is shown in FIG. 9.

FIG. 11A to 11D show the measurements of the structure. One side on the front side of the bottom face of the structure is L, one side on the side face is D, and the height of the structure is H. The intermediate point of the front side end 211A and back side end 211B of the bottom face of the structure is 211D. The length from 211A to 211D is d, the length from 211D to the center 215A of the bottom face 210A is I, and the length from 211D to 213C is h. Then, the structure is formed to satisfy the relationship of:

$$0 \leq L-2I/L2$$

$$0 \leq d \leq D/2$$

$$0 \leq h \leq H$$

This structure is formed from metal, resin or Styrofoam.

In the concave portion 217 formed at the bottom face of the structure 210, as shown in FIG. 12A, so long as the relationship of $0 \leq -2I \leq L/2$ is satisfied, the size of L−2I may be larger than 0. In other words, the apex of the semitriangular concave portion 217 does not have to be formed at the single point of 215A, and there may be several apexes as shown with 215B and 215C, and the space between such apexes may be distant.

Further, as shown in FIG. 12B, 211C may be provided at a position that is more inside than the front side end 211A of the bottom face, and 211E may be provided at a position that is more inside than the back side end 211B of the bottom face, respectively, and the concave portion 217 may be formed from such 211C and 211D toward the center of the structure. Here, when the length from 211A to 211C is a, the length from 211E to 211B is b, length a or b from 211C or 211E to 211D may be formed shorter than one side D/2 on the side of the bottom face of the structure 210 so that a, b<D/2.

Incidentally, the ridge line 213D formed from the center 215A of the bottom face 210A so as to connect the inclined faces 213A, 213B and the intersection 213C, for instance, as shown in FIG. 13, may also be a curved line. Here, one side on the front side of the bottom face of the structure is L, one side on the side face is D, and the height of the structure is H. The intermediate point of the front side end 211A and back side end 211B of the bottom face of the structure is 211D. The length from 211A to 211D is d, the length from 211D to the center 215A of the bottom face 210A is I, and the length from 211D to 213C is h. Then, the structure is formed to satisfy the relationship of:

$$0 \leq L-2I \leq L/2$$

$$0 \leq d \leq D/2$$

$$0 \leq h \leq H$$

Further, when the angles shown in FIG. 13B to 13E are set to α, β, γ, σ, ε, the structure is formed to satisfy the relationship of $0° < α, β, γ, ζ, σ, ε < 90°$.

Figure 14:
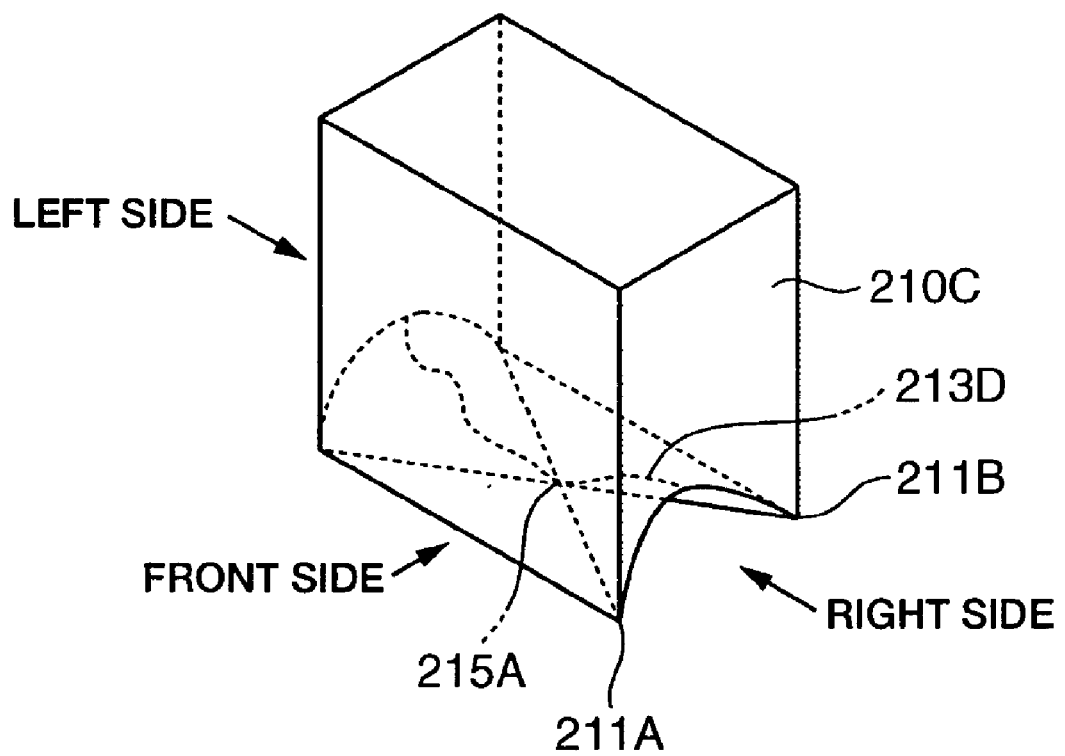
FIG. 14 is a diagram showing a modified example of the structure.

Moreover, the shape of the concave portion 217 formed on the bottom face of the structure 210 does not necessarily have to be a shape similar to a cone shape, and, as shown in FIG. 14, may be configured by combining various shapes such as an oval shape or circular shape. Further still, the ridge line 213D formed so as to connect the inclined faces 213A, 213B and the intersection 213C does not necessarily have to be a straight line, and may also be a flux line, curved line, or formed in a staircase pattern. Furthermore, the ridge line 213D does not necessarily have to be a symmetrical line profile.

Figure 15:
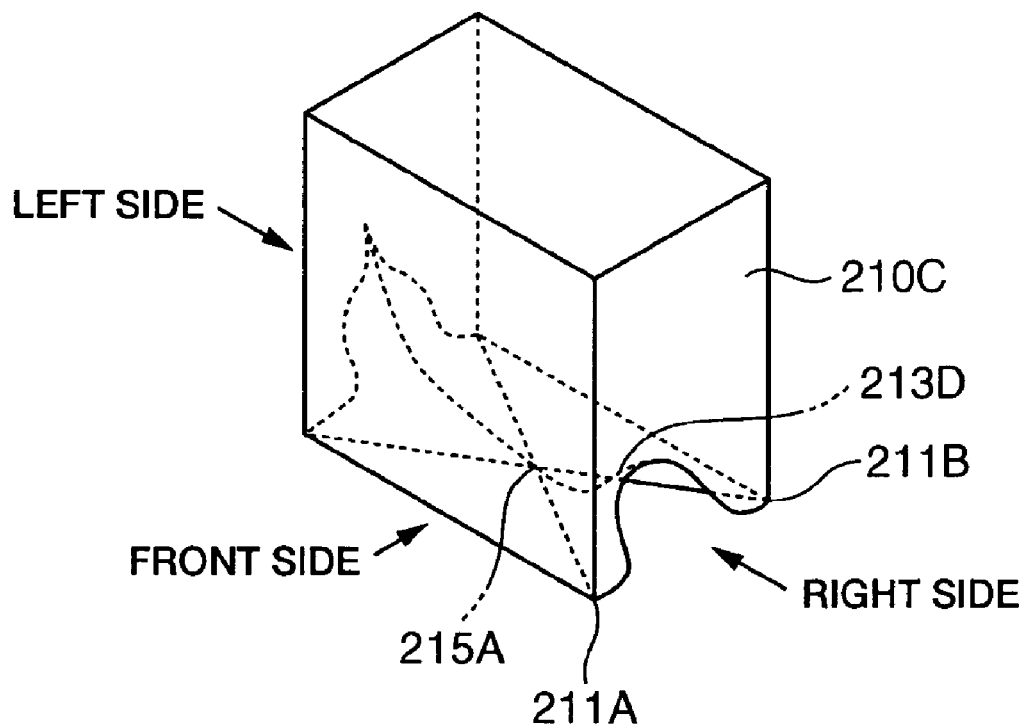
FIG. 15 is a diagram showing a modified example of the structure.

In addition, the shape of the cut area of the concave portion 217 appearing on the side face 210C of the structure 210 does not necessarily have to be triangular, and, as shown in FIG. 15, may be a semi oval shape or circular shape, and there is no particular limitation in the shape of the cut area so as long as the concave portion has some kind of depression. Moreover, the cut area does not necessarily have to take on a symmetrical shape on both side faces.

The embodiments of the present invention were described above to facilitate the understanding of the present invention, and are not intended to limit the interpretation of the present invention in any way. The present invention may be modified or improved without deviating from the gist thereof, and equivalents of the present invention are also included therein.

What is claimed is:

1. A storage apparatus having in a cabinet, and arranged in one direction, a memory medium housing unit for storing a plurality of memory mediums, a control unit for performing data I/O processing to said memory mediums in response to a data I/O request from an upper-level host system, and a power supply unit for supplying power to said memory medium housing unit and said control unit, comprising:
   a plurality of cooling areas formed in said cabinet;
   an external air introduction/discharge device for directing external air to the respective cooling areas, and thereafter discharging said external air from a discharge area of said cabinet outside said cabinet;
   an external air guidance area for guiding the external air that passed through each of said cooling areas to said discharge area; and
   a structure of partitioning said external air guidance area into a first area and a second area,
      wherein said external air guidance area is configured so that said external air that passed through one of said plurality of cooling areas will not get mixed with said external air that passed through another of said plurality of cooling areas,
      wherein the structure has first and second inclined faces that form a first portion of a bottom surface of the structure, and wherein a second portion of the bottom surface of the structure is formed having a flat, uninclined surface, and
      wherein the first and second inclined faces of the bottom surface of the structure correspond to a pair of semi-triangular cone-shaped concave portions that extend from a center of the bottom surface of the structure to left and rights sides of the structure, respectively.

2. The storage apparatus according to claim 1, wherein said external air introduction/discharge device is configured from a first device and a second device;
   wherein said first device discharges the external air that passed through said one of said plurality of cooling areas outside said cabinet from said discharge area via said first area; and
   wherein said second device discharges the external air that passed through said another of said plurality of cooling areas outside said cabinet from said discharge area via said second area.

3. The storage apparatus according to claim 1, wherein said first area is formed near a center of said cabinet, and said second area is formed outboard of said cabinet, and wherein the first and second inclined faces of the bottom surface of the structure correspond to a pair of oval- or circular-shaped portions that extend from a center of the bottom surface of the structure to left and rights sides of the structure, respectively.

4. The storage apparatus according to claim 2, wherein said one of said plurality of cooling areas and said another of said plurality of cooling areas are formed in said cabinet along the direction of gravitational force, said first device is provided at the upper end of said cabinet, and said second device is provided between said one of said plurality of cooling areas and said another of said plurality of cooling areas.

5. The storage apparatus according to claim 1, wherein said first area discharges the external air that passed through said one of said plurality of cooling areas outside said cabinet from said discharge area, and said second area discharges the external air that passed through said another of said plurality of cooling areas outside said cabinet from said discharge area; and wherein said structure directs the external air that passed through said second area outside said first area.

6. The storage apparatus according to claim 3, wherein said first area and said second area are inwardly formed in the cabinet from an outer peripheral face of said cabinet, said first area is formed from the center of said one of said plurality of cooling areas toward said discharge area, and said second area is formed around said one of said plurality of cooling areas toward said discharge area via the center of said another of said plurality of cooling areas, and wherein a ridge line formed by intersection of the first and second inclined faces of the bottom surface of the structure comprises either a curved line, a flux line, or a staircase line.

7. The storage apparatus according to claim 1, wherein the structure of partitioning said external air guidance area into the first area and the second area is provided to a boundary of said another of said plurality of cooling areas and said one of said plurality of cooling areas.

8. The storage apparatus according to claim 1, wherein said one of said plurality of cooling areas is formed in said memory medium housing unit, and said another of said plurality of cooling areas is formed in said control unit.

9. The storage apparatus according to claim 8, wherein said one of said plurality of cooling areas is formed in said memory medium housing unit, and said other another of said plurality of cooling areas is formed in said control unit; and wherein said memory medium housing unit is configured from a first housing unit and a second housing unit, and wherein said structure has a boundary surface facing said one of said plurality of cooling areas, and directs the external air that passed through said first cooling passage toward said discharge area in said structure via said boundary surface is disposed between said first housing unit and said second housing unit, and said boundary surface is provided respectively facing said first housing unit and said second housing unit.

10. The storage apparatus according to claim 9, wherein an opening for directing the external air that respectively passed through said first housing unit and said second housing unit inside said structure is formed in said boundary surface.

11. The storage apparatus according to claim 8, wherein said second area is formed between said memory medium housing unit and the lateral end of said cabinet.

12. The storage apparatus according to claim 1, wherein said first inclined face and second inclined face are formed in an approximate circular arc.

13. The storage apparatus according to claim 1, wherein the structure is formed to satisfy the following relationships:

$0<L-2I<L2,$ $0<d<D/2,$ and $0<h<H$ wherein:

L corresponds to a length of the structure,

I corresponds to a length of the first and second inclined faces,

H corresponds to a height of the structure, h corresponds to a height of the first and second inclined faces, D corresponds to a width of the structure, and d corresponds to a width of the first and second inclined faces.

* * * * *